(12) United States Patent
Hoshino et al.

(10) Patent No.: US 11,565,939 B2
(45) Date of Patent: Jan. 31, 2023

(54) SILICON CORE WIRE

(71) Applicant: Shin-Etsu Chemical Co., Ltd., Tokyo (JP)

(72) Inventors: Naruhiro Hoshino, Niigata (JP); Tetsuro Okada, Niigata (JP); Masahiko Ishida, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 323 days.

(21) Appl. No.: 16/843,722

(22) Filed: Apr. 8, 2020

(65) Prior Publication Data

US 2020/0331764 A1 Oct. 22, 2020

(30) Foreign Application Priority Data

Apr. 19, 2019 (JP) .............................. JP2019-079879

(51) Int. Cl.
| | |
|---|---|
| *C23C 16/24* | (2006.01) |
| *F16B 7/18* | (2006.01) |
| *H01R 13/46* | (2006.01) |
| *H01B 1/04* | (2006.01) |
| *C01B 33/02* | (2006.01) |
| *C01B 33/035* | (2006.01) |

(52) U.S. Cl.
CPC ............ *C01B 33/02* (2013.01); *C01B 33/035* (2013.01); *C23C 16/24* (2013.01); *F16B 7/182* (2013.01); *H01R 13/46* (2013.01); *H01B 1/04* (2013.01); *Y10T 428/2975* (2015.01)

(58) Field of Classification Search
CPC ......... C01B 33/02; C01B 33/035; H01B 1/04; C23C 16/24; F16B 7/182; H01R 13/46

USPC ....................................... 252/521.3; 428/398
See application file for complete search history.

(56) References Cited

U.S. PATENT DOCUMENTS

| | | | | |
|---|---|---|---|---|
| 6,488,317 | B1 * | 12/2002 | Daoud ................ | H02G 3/0675 |
| | | | | 285/345 |
| 2002/0076273 | A1 * | 6/2002 | Carstensen .......... | F16B 37/145 |
| | | | | 403/305 |
| 2003/0014202 | A1 | 1/2003 | Kuan et al. | |

(Continued)

FOREIGN PATENT DOCUMENTS

| | | |
|---|---|---|
| EP | 2108619 A2 | 10/2009 |
| EP | 2161241 A2 | 3/2010 |

(Continued)

OTHER PUBLICATIONS

Notice of Reason for Refusal from JP app. No. 2019-079879, dated Jan. 11, 2022, with English translation from Global Dossier, all pages.

(Continued)

*Primary Examiner* — Tri V Nguyen
(74) *Attorney, Agent, or Firm* — Ladas & Parry, LLP

(57) ABSTRACT

In the silicon core wire according to a first aspect of the present invention, a male thread part formed at one end of a first thin silicon rod and a female thread part formed at one end of a second thin silicon rod may be screwed together and fastened. In the silicon core wire according to a second aspect of the present invention, a thread part formed at one end of a first thin silicon rod and a thread part formed at one end of a second thin silicon rod may be screwed together and fastened via an adapter with thread parts formed at both ends.

2 Claims, 5 Drawing Sheets

(56) References Cited

U.S. PATENT DOCUMENTS

| | | | |
|---|---|---|---|
| 2009/0238992 A1 | 9/2009 | Endoh et al. | |
| 2010/0058988 A1 | 3/2010 | Endoh et al. | |
| 2011/0220283 A1 | 9/2011 | Nagaura et al. | |
| 2011/0229717 A1 | 9/2011 | Kraus | |
| 2012/0060562 A1 | 3/2012 | Wochner et al. | |
| 2017/0167023 A1* | 6/2017 | Proia | C23C 16/45563 |

FOREIGN PATENT DOCUMENTS

| | | | |
|---|---|---|---|
| JP | 2001302256 A | 10/2001 |
| JP | 2004035311 A | 2/2004 |
| JP | 2010090024 A | 4/2010 |
| JP | 2011116634 A | 6/2011 |
| JP | 2011195441 A | 10/2011 |
| JP | 2012062243 A | 3/2012 |
| JP | 2016033112 A | 3/2016 |
| JP | 3206952 U | 10/2016 |
| JP | 3206953 U | 10/2016 |
| JP | 2018122340 A | 8/2018 |

OTHER PUBLICATIONS

Extended European Search Report from EP app. No. 20167200.3, dated Aug. 13, 2020.
Notice of Allowance for Japanese Patent Application 2019-079879 dated Apr. 5, 2022, and its English translation provided by Google Translate.

* cited by examiner

FIG. 1A
FIG. 1B
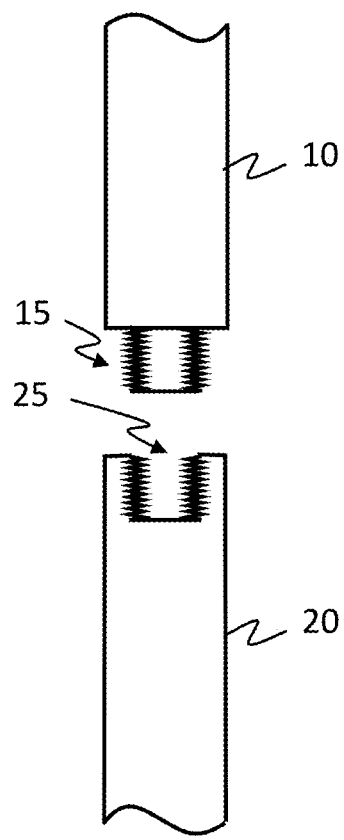
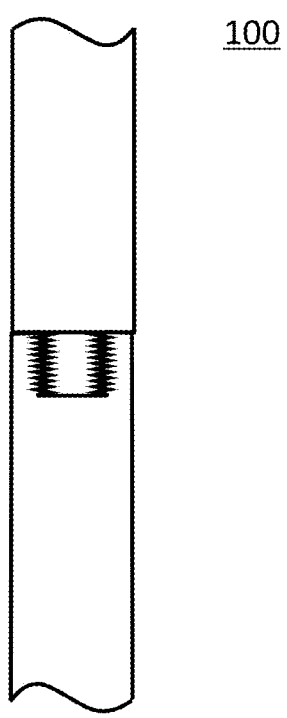

FIG. 2A
FIG. 2B
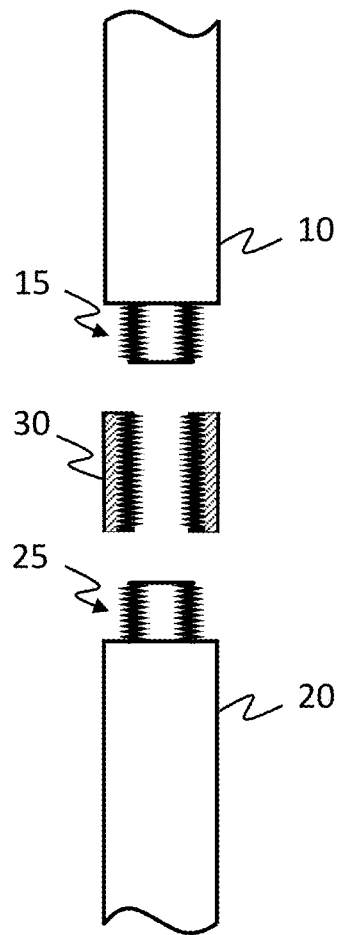
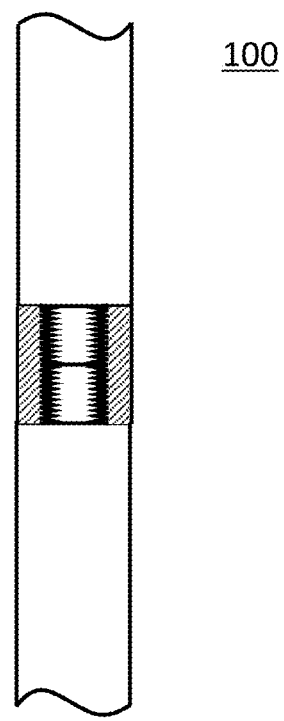

SILICON CORE WIRE

BACKGROUND

Technical Field

The present invention relates to a structure of a silicon core wire used for producing polycrystalline silicon, or the like.

Related Art

The present application claims the priority of Japanese Patent Application No. 2019-079879 filed on Apr. 19, 2019, the contents of which are entirely incorporated by reference.

BACKGROUND OF THE ART

Polycrystalline silicon is used as a raw material of monocrystalline silicon for producing a semiconductor or of silicon for producing a solar cell. As a method for producing polycrystalline silicon, the Siemens process is known. In this method, generally, silane-based raw material gas is brought into contact with a heated silicon core wire (thin silicon rod), and the polycrystalline silicon is deposited on a surface of the silicon core wire by the chemical vapor deposition (CVD) method.

In this Siemens process, two thin silicon rods extending in a vertical direction and one thin silicon rod extending in a horizontal direction are assembled into an inverted-U shape. Then, bottom ends of the two thin silicon rods extending in the vertical direction are connected to core wire holders and fixed to a pair of metal electrodes arranged on a base plate. In general, in a reacting furnace, a plurality of sets of inverted-U shaped silicon core wires is arranged.

When the silicon core wire is heated to a deposition temperature by energization and supplied with raw material gas (for example, mixed gas of trichlorosilane and hydrogen), polycrystalline silicon is vapor-deposited on a surface of the silicon core wire by a CVD reaction, and a polycrystalline silicon rod having a desired diameter is formed in an inverted-U shape.

In production of monocrystalline silicon by the floating-zone method, both ends of two vertically extending polycrystalline silicon rods of polycrystalline silicon formed in an inverted-U shape are cut off to form a cylindrical polycrystalline silicon rod, which is used as a raw material for growing monocrystalline silicon. As a matter of course, a longer cylindrical polycrystalline silicon rod to be the raw material is preferable, because longer monocrystalline silicon can be pulled up at one time. For that purpose, it is assumed that the above-described silicon core wire is sufficiently long in the vertical direction.

By the way, the thin silicon rods constituting the above-described inverted-U shaped silicon core wire are collected from polycrystalline or monocrystalline silicon rods. The thin silicon rods are shortened by a length of a part of these silicon rods cut off when removed from the reacting furnace. As a result, when obtaining a silicon core wire sufficiently long in the vertical direction, the thin silicon rods may not be sufficiently long, requiring addition of the short thin silicon rods.

JP 2011-116634 A discloses an invention, made in view of such a problem, of a silicon seed production device and silicon seed production method capable of producing a high-quality silicon seed, which is easy to control and has very few defects. In short, the invention is to obtain one long thin silicon rod by melting and fixing ends of two thin silicon rods.

JP 2012-62243 A and JP 2018-122340 A also disclose methods for unifying two thin silicon rods by such welding.

In addition, US 2003/014202 A discloses an aspect in which one end of a thin silicon rod is processed into a tapered shape and pushed into a hole provided in an adapter, so that two thin silicon rods are unified. JP 2011-195441 A discloses an aspect in which two thin silicon rods are unified via a disk including a material having lower specific electrical resistance than specific electrical resistance a silicon material has.

SUMMARY

However, there is a concern about contamination during welding in a case of unification of thin silicon rods by welding as disclosed in JP 2011-116634 A, JP 2012-62243 A, or JP 2018-122340 A. In addition, fixing of thin silicon rods via an adapter as described in US 2003/014202 A requires hard pushing of a thin silicon rod into a hole of the adapter, by which chipping may occur or the thin silicon rod may collapse when assembled into an inverted-U shape due to instability of a connecting part. Furthermore, there is a concern about contamination during a process of depositing polycrystalline silicon by the Siemens process if thin silicon rods are unified by using a member different from a silicon member, as described in US 2003/014202 A and JP 2011-195441 A.

The present invention has been made in view of such a problem, and an object of the present invention is to provide a simple and less expensive long silicon core wire (thin silicon rod) having less risk of contamination and collapse.

In order to solve the above problems, in the silicon core wire according to a first aspect of the present invention, a male thread part formed at one end of a first thin silicon rod and a female thread part formed at one end of a second thin silicon rod may be screwed together and fastened.

In the silicon core wire according to a second aspect of the present invention, a thread part formed at one end of a first thin silicon rod and a thread part formed at one end of a second thin silicon rod may be screwed together and fastened via an adapter with thread parts formed at both ends.

In the silicon core wire according to the second aspect, the adapter may be a silicon member.

In the silicon core wire according to the first aspect and the second aspect, the first thin silicon rod and the second thin silicon rod may be thin silicon rods collected from a polycrystalline silicon rod or a monocrystalline silicon rod.

According to the present invention a simple and less expensive long silicon core wire (thin silicon rod), having less risk of contamination and collapse, is provided.

BRIEF DESCRIPTION OF DRAWINGS

FIGS. 1A and 1B are diagrams for describing a silicon core wire according to a first aspect of the present invention;

FIGS. 2A and 2B are diagrams for describing a first example of a silicon core wire according to a second aspect of the present invention;

DETAILED DESCRIPTION

Figure 3A:
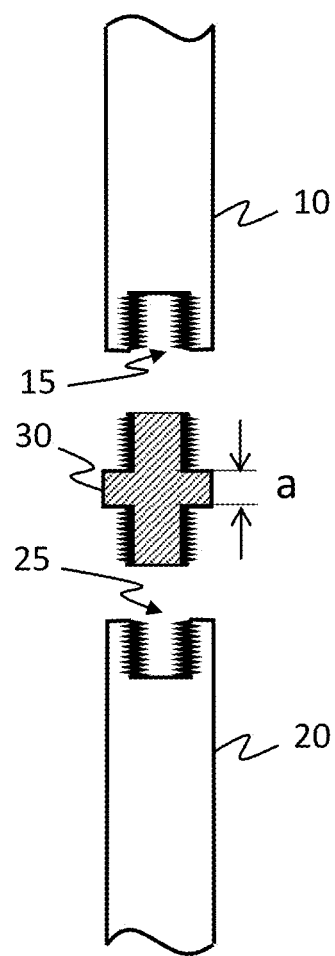
FIGS. 3A and 3B are diagrams for describing a second example of a silicon core wire according to the second aspect of the present invention.

An embodiment of the present invention will be described below with reference to the drawings.

FIGS. 1A and 1B are diagrams for describing a silicon core wire of a first aspect according to the present invention. FIGS. 1A and 1B, respectively, illustrate a silicon core wire before and after thin silicon rods are unified. As illustrated in these diagrams, a male thread part 15 is formed at one end of a first thin silicon rod 10, and a female thread part 25 is formed at one end of a second thin silicon rod 20. These thread parts are screwed together and fastened to be unified into one silicon core wire 100.

These thin silicon rods are collected, for example, from polycrystalline silicon rods or monocrystalline silicon. Cross-sectional shape of a thin silicon rod is generally rectangular, although there is no particular limitation.

The thread parts of the thin silicon rods are formed by machining, and the processed thin silicon rods are cleaned by etching to remove contamination. Because silicon of these thread parts is slightly removed by the etching, the thread parts are machined in consideration of portion to be removed by the etching so that the etched thread parts are screwed together.

A screwing part is less likely to be heated abnormally with the unification using such thread parts, because the thread parts are screwed together by surface contact that allows secure fixation, and the silicon core wire is energized stably.

FIGS. 2A and 2B are diagrams for describing a first example of a silicon core wire of a second aspect according to the present invention. FIGS. 2A and 2B, respectively, illustrate a silicon core wire before and after thin silicon rods are unified. In this aspect, a male thread part 15 is formed at one end of a first thin silicon rod 10, and a male thread part 25 is formed at one end of a second thin silicon rod 20. These thread parts are screwed together and fastened to be unified into one silicon core wire 100 via an adapter 30 with thread parts formed at both ends.

Figure 3B:
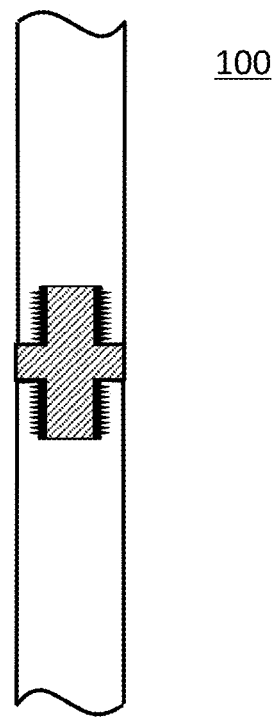

FIGS. 3A and 3B are diagrams for describing a second example of a silicon core wire of the second aspect according to the present invention. FIGS. 3A and 3B, respectively, illustrate a silicon core wire before and after thin silicon rods are unified. In this aspect, a female thread part 15 is formed at one end of a first thin silicon rod 10, and a female thread part 25 is formed at one end of a second thin silicon rod 20. These thread parts are screwed together and fastened to be unified into one silicon core wire 100 via an adapter 30 with thread parts formed at both ends.

Although thickness (width) a of a straight body part of an adapter 30 is set in consideration of an entire length of a silicon core wire 100 here, the thickness a may be zero. When a=0, the sum of lengths of the first thin silicon rod 10 and the second thin silicon rod 20 is the entire length of the silicon core wire 100. In a case where the thickness a of the straight body part of the adapter 30 is zero, there are advantages that fewer members are used for the adapter 30, and the silicon core wire is less likely to be bent during production because the number of engagement points is reduced from two to one, which enhances rigidity of the silicon core wire.

Note that the adapter 30 is not limited to an adapter 30 of these aspects, and an aspect in which a male thread part is formed at one end and a female thread part is formed at another end may be used. In addition, from a viewpoint of preventing contamination, and the like, it is preferable that the above-described adapter 30 is a silicon member. Furthermore, from a viewpoint of smooth screwing, a small hole may be provided in the adapter 30 for air bleeding.

[Example 1]

A monocrystalline thin silicon rod was prepared, and a male thread part was formed at one end of the monocrystalline thin silicon rod. In addition, an adapter having a female thread inside as illustrated in FIGS. 2A and 2B was prepared. The adapter was provided with a small hole for air bleeding. Ten sets of two such thin silicon rods and one such adapter were prepared, and these members were cleaned by etching.

The above-described two thin silicon rods were unified via the adapter to obtain a total of ten long silicon core wires, which were then used to assemble five inverted-U shaped silicon core wires.

The obtained inverted-U shaped silicon core wires were set in a reacting furnace, and polycrystalline silicon rods were grown up to 130 mm in diameter by the Siemens process. The experiment process was completed without causing an accident such as abnormal growth or damage of the polycrystalline silicon rods. In addition, the hole provided for air bleeding allowed gas inside the screwing part to be replaced and reaction gas to flow into the hole, which accelerated growth of polycrystalline silicon inside the screwing part, resulting in tighter connection of the screwing parts.

[Comparative Example 1]

Figure 4A:
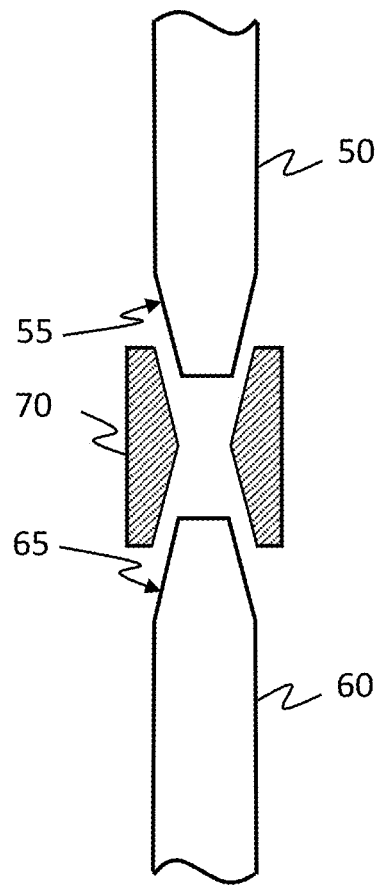
FIGS. 4A and 4B are diagrams for describing a silicon core wire of Comparative Example 1.
Figure 4B:
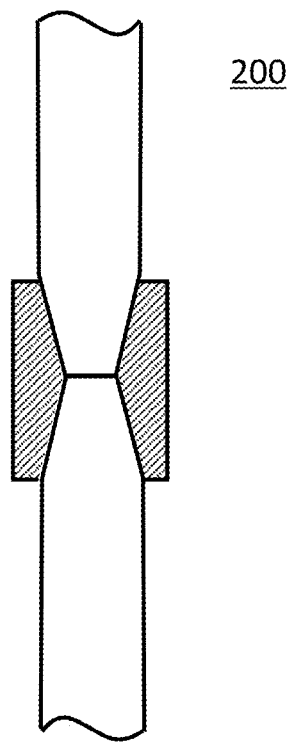

As illustrated in FIGS. 4A and 4B, monocrystalline thin silicon rods 50, 60 having one end face tapered in a projected shape 55, 65, and an adapter 70 having both end faces tapered in a recessed shape were prepared. Ten sets of two such thin silicon rods and one such adapter were prepared, and these members were cleaned by etching.

The above-described two thin silicon rods were unified via the adapter to obtain a total of ten long silicon core wires, which were then used to assemble five inverted-U shaped silicon core wires. One set from among the five sets of the inverted-U shaped silicon core wires had a tapered part damaged during assembly.

The four inverted-U shaped silicon core wires obtained by the assembly were set in a reacting furnace, and polycrystalline silicon rods were grown up to 130 mm in diameter by the Siemens process. One from among the four inverted-U shaped silicon core wires inclined when energized. The cause of the incline was examined and determined to be melting at a tapered part, which is considered to be attributed to abnormal heating.

[Comparative Example 2]

Figure 5A:
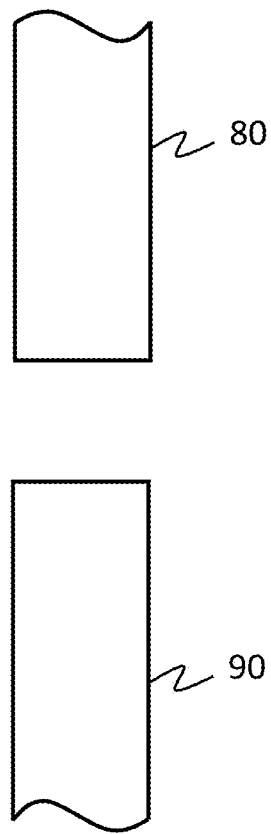
FIGS. 5A and 5B are diagrams for describing a silicon core wire of Comparative Example 2.
Figure 5B:
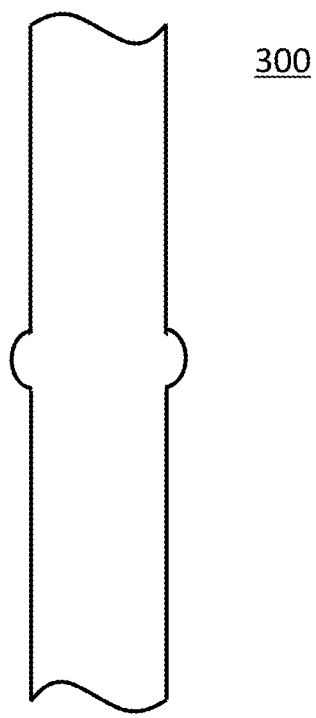

As illustrated in FIGS. 5A and 5B, two monocrystalline thin silicon rods 80, 90 were prepared, cleaned by etching, and then unified by welding. Ten thin silicon rods unified by welding, which were etched again, were prepared to assemble five inverted-U shaped silicon core wires.

These five inverted-U shaped silicon core wires were set in a reacting furnace, and polycrystalline silicon rods were grown up to 130 mm in diameter by the Siemens process. One from among the five inverted-U shaped silicon core wires was damaged when energized. The cause of the damage was examined and determined to be breakage of a welded part. The breakage is considered to be a phenomenon caused by strain remained at a portion heated to a high temperature during welding.

According to the present invention, a simple and less expensive long silicon core wire (thin silicon rod), having less risk of contamination and collapse, is provided.

REFERENCE SIGNS LIST

10, 20, 30, 40, 50, 60, 70, 80, 90 Thin silicon rod
15 Male thread part
25 Female thread part
30, 70 Adapter
55, 65 Tapered part
100, 200, 300 Long silicon core wire

What is claimed is:

1. A silicon core wire,
wherein a male thread part formed at one end of a first silicon rod and a male thread part formed at one end of a second silicon rod are screwed together and fastened via an adapter with female thread parts formed at both ends,
wherein the adapter covers the male thread part formed at the one end of the first silicon rod and the male thread part formed at the one end of the second silicon rod from outside, and wherein the adapter is a silicon member.

2. The silicon core wire according to claim 1, wherein the first silicon rod and the second silicon rod are silicon rods collected from a polycrystalline silicon rod or a monocrystalline silicon rod.

\* \* \* \* \*